(12) United States Patent
Jang et al.

(10) Patent No.: US 7,074,728 B2
(45) Date of Patent: Jul. 11, 2006

(54) METHOD FOR CRYSTALLIZING AMORPHOUS FILM AND METHOD FOR FABRICATING LCD BY USING THE SAME

(75) Inventors: Jin Jang, Seoul (KR); Kyung Ho Kim, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 163 days.

(21) Appl. No.: 10/189,454

(22) Filed: Jul. 8, 2002

(65) Prior Publication Data

US 2003/0013237 A1   Jan. 16, 2003

(30) Foreign Application Priority Data

Jul. 10, 2001   (KR)   ............... 2001-41377

(51) Int. Cl.
*H01L 21/26* (2006.01)
*H01L 21/326* (2006.01)

(52) U.S. Cl. ...................... 438/795; 438/466
(58) Field of Classification Search ........ 438/149–166, 438/466, 470, 795
See application file for complete search history.

(56) References Cited

U.S. PATENT DOCUMENTS

| | | | |
|---|---|---|---|
| 5,612,250 A * | 3/1997 | Ohtani et al. | 438/795 |
| 5,985,741 A * | 11/1999 | Yamazaki et al. | 438/486 |
| 6,306,692 B1 * | 10/2001 | Seo et al. | 438/149 |
| 6,309,951 B1 * | 10/2001 | Jang et al. | 438/486 |
| 6,326,226 B1 * | 12/2001 | Jang et al. | 438/486 |
| 6,342,409 B1 * | 1/2002 | Seo | 438/161 |
| 6,541,294 B1 * | 4/2003 | Yamazaki et al. | 438/29 |
| 6,656,779 B1 * | 12/2003 | Kasahara | 438/166 |
| 6,706,568 B1 * | 3/2004 | Nakajima | 438/149 |
| 7,001,829 B1 * | 2/2006 | Yamazaki | 438/479 |
| 2002/0052069 A1 * | 5/2002 | Jiroku et al. | 438/166 |
| 2002/0055208 A1 * | 5/2002 | Ohtani et al. | 438/151 |
| 2002/0086468 A1 * | 7/2002 | Kim et al. | 438/156 |
| 2002/0086469 A1 * | 7/2002 | Kim et al. | 438/166 |
| 2002/0086470 A1 * | 7/2002 | Kim et al. | 438/166 |

* cited by examiner

*Primary Examiner*—Scott B. Geyer
(74) *Attorney, Agent, or Firm*—McKenna Long & Aldridge LLP

(57) ABSTRACT

A method for crystallizing an amorphous film by using an electric field and an ultraviolet (UV) ray, and method for fabricating an LCD by using the same. The method for crystallizing an amorphous film includes forming an amorphous film having a catalytic metal deposited thereon on a substrate, irradiating a UV ray on the amorphous film, and applying an electric field to the amorphous film.

30 Claims, 9 Drawing Sheets before crystallization after crystallization

US 7,074,728 B2

METHOD FOR CRYSTALLIZING AMORPHOUS FILM AND METHOD FOR FABRICATING LCD BY USING THE SAME

This application claims the benefit of the Korean Application No. P2001-41377 filed on Jul. 10, 2001, which is hereby incorporated by reference for all purposes as if fully set forth herein.

BACKGROUND OF THE INVENTION

1. Field of the Invention

The present invention relates to a method for crystallizing an amorphous film, and more particularly, to a method for crystallizing an amorphous film by an electric field and an ultraviolet (UV) ray, and a method for fabricating a liquid crystal display device (LCD) by using the same.

2. Background of the Related Art

As devices become larger and more integrated, switching devices become thinner. As a consequence the present amorphous silicon thin film transistors are replaced with polycrystalline thin film transistors.

With a process temperature below 350° C., though the amorphous silicon thin film transistor can be fabricated on a glass substrate with ease, it is difficult to employ the amorphous silicon thin film transistor in a fast operation circuit due to low mobility.

However, since polycrystalline silicon has a mobility higher than amorphous silicon, a driving circuit can be fabricated on a glass substrate. Therefore, polycrystalline silicon is favorable for a switching device of a high resolution, large sized device.

Polycrystalline silicon may be formed by direct deposition of the polycrystalline silicon, or crystallizing amorphous silicon after the amorphous silicon is deposited. The latter method may include Solid Phase Crystallization (SPC), Excimer Laser Annealing (ELA), Metal Induced Crystallization (MIC), and the like.

A high crystallization temperature and a long heat treatment time period are essential in the SPC method, though SPC is comparatively simple since it only requires a lengthy time period of heat treatment in a furnace in which the temperature is more than 600° C. for forming the polycrystalline film. SPC has disadvantages in that fabrication of a device by SPC has many difficulties because SPC causes many defects inside the crystallized grains, and a glass substrate cannot be used due to the high crystallizing temperature.

The ELA method, in which an excimer laser with a short wave length and a high energy is irradiated momentarily for crystallizing a thin film, facilitates a low temperature crystallization at a temperature below 400° C., and produces a large sized grain with excellent properties. However, since ELA progresses non-uniform crystallization and requires expensive equipment, ELA is not suitable for mass production and fabrication of large sized devices.

The MIC method, introduced through research in decreasing the crystallization temperature, facilitates crystallization at a temperature below 500° C., and is favorable for fabrication of a large sized LCD.

Field Enhanced-Metal Induced Crystallization (FE-MIC) has been developed as an advanced form of MIC for crystallizing at a low temperature by using catalytic metal in an electric field. In the FE-MIC method, the crystallization temperature of a thin film decreases significantly when a metal impurity is added to an amorphous silicon film because free electrons of the metal decrease a bonding energy of the silicon due to an action of the free electrons of the metal.

FE-MIC is favorable for large sized glass substrate applications because crystallization time is shortened and the crystallization temperature decreases significantly compared to the present MIC method when an electric field is applied to the amorphous silicon film having the catalytic metal contained therein. In general, FE-MIC is influenced by an amount of catalytic metal; the more the catalytic metal, the lower the crystallization temperature.

The steps of a related art method for crystallizing an amorphous film, and the steps of a related art method for fabricating an LCD by using the same will be explained, with reference to the attached drawings.

First, the steps of a related art method for crystallizing an amorphous film will be explained.

Referring to FIG. 1A, a buffer layer 2 is formed on a substrate 1, and an amorphous silicon is deposited thereon at 300–400° C. by Plasma Enhanced CVD (PECVD), Low-Pressure CVD (LPCVD) using silane gas or by sputtering to form an amorphous silicon thin film 3. The buffer layer 2 prevents impurities in the substrate 1 from diffusing into the amorphous silicon thin film 3, and cuts off thermal flow to the substrate I in a later crystallization.

Next, referring to FIG. 1B, a metal, such as nickel, is deposited on the amorphous thin film 3 by using plasma to form a catalytic metal layer 4, and annealed by using a high temperature lamp. In this instance, the nickel atoms diffuse into the amorphous silicon thin film to form nickel silicide that accelerates the crystallization.

Then, referring to FIG. 1C, an electric field is applied to the amorphous silicon thin film 3 having the catalytic metal layer 4 formed thereon by means of electrodes 5 provided at both ends thereof. This causes growth of needle-like forms of crystalline grains in an <111> orientation by movement of the nickel silicide, leading to a decrease in bonding energy of the amorphous silicon thin film by the free electrons of the nickel atoms, and the crystallization time period is shortened as the nickel atom acts as a seed of the crystallization.

Thus, the amorphous silicon thin film 3 is crystallized into a polycrystalline silicon thin film. FE-MIC, a low temperature crystallization method which uses a catalytic metal in an electric field, is advantageous in that a crystallization rate is high, cost is low, and application to large sized glass substrates is possible.

A related art method for fabricating an LCD by using FE-MIC will be explained.

First, a buffer layer is formed of a silicon oxide on a thin film array substrate, and an amorphous silicon thin film is formed thereon. An electric field is applied to the amorphous silicon thin film while heating the amorphous silicon thin film, to crystallize the amorphous silicon thin film into a polycrystalline silicon thin film.

Next, the polycrystalline silicon thin film is patterned, to form an active semiconductor layer. Silicon nitride SiNx is deposited on an entire surface inclusive of the semiconductor layer, to form a gate insulating film.

Then, a low resistance metal film is deposited on the gate insulating film, patterned by photolithography, to form a gateline and a gate electrode, and impurities are injected into the semiconductor layer with the gate patterns used as mask, to form source/drain regions.

Next, source/drain electrodes are formed for crossing the dataline perpendicular to the gateline and the source/drain regions. The data patterns are insulated from the gate patterns by an interlayer insulating film.

Then, a protection film is formed on an entire surface including the source/drain electrodes, and a pixel electrode is formed connected to the drain electrode through the protection film, thereby completing fabrication of an array substrate of an LCD.

When a color filter substrate with a color filter layer and a common electrode is bonded to the thin film array substrate, and a liquid crystal layer is formed between the two substrates, the LCD is formed.

However, the related art method for crystallizing an amorphous film, and a method for fabricating an LCD by using the same have the following problems.

Application of the method for crystallizing an amorphous film to large sized glass substrates requires a low crystallization temperature and a uniform heat treatment throughout the substrate.

However, the related art heat treatment using a lamp is limited in applications to large sized devices due to difficulty in maintaining the uniformity of the heat treatment temperature which causes a problem of substrate deformation resulting from temperature rise of the large sized glass substrate.

SUMMARY OF THE INVENTION

Accordingly, the present invention is directed to a method for crystallizing an amorphous film, and a method for fabricating an LCD by using the same that substantially obviates one or more of the problems due to limitations and disadvantages of the related art.

An advantage of the present invention is to provide a method for crystallizing an amorphous film, and a method for fabricating an LCD by using the same, in which an electric field is applied and a UV ray is irradiated, for crystallizing an amorphous silicon thin film into a polycrystalline thin film within a short time period.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for crystallizing an amorphous film includes forming an amorphous film having a catalytic metal deposited thereon on a substrate; irradiating a UV ray on the amorphous film; and applying an electric field to the amorphous film.

In another aspect of the present invention, there is provided a method for fabricating an LCD using a method for crystallizing an amorphous silicon film, including forming an amorphous film having a catalytic metal deposited thereon on a first substrate; irradiating a UV ray and applying an electric field to the amorphous film to crystallize the amorphous film into a polycrystalline film; patterning the polycrystalline film to form a semiconductor layer; forming a gate electrode on a region of the semiconductor layer insulated from the gate electrode; injecting impurities into the semiconductor layer to form a channel region and source/drain regions; forming source/drain electrodes connected to the source/drain regions, respectively; forming a pixel electrode connected to the drain electrode; and forming a liquid crystal layer between the first substrate and a second substrate opposite to the first substrate.

During the annealing process for crystallizing the amorphous film, the present invention does not employ a high temperature lamp, but irradiates a UV ray. The UV ray is used for elevating a temperature of the amorphous film simply by a difference of absorption coefficients of the amorphous film and the glass substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the illustrated embodiments of the present invention, examples of which are illustrated in the accompanying drawings.

First Embodiment

FIGS. 2A–2D illustrate a method for crystallizing an amorphous silicon film in accordance with a first embodiment of the present invention.

Figure 1A:
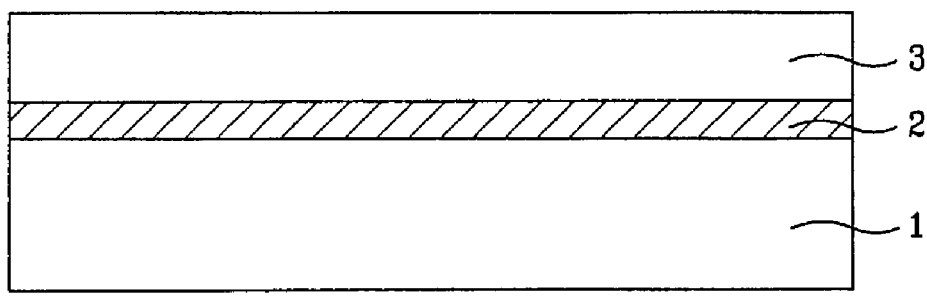
FIGS. 1A–1C illustrate the steps of a related art method for crystallizing an amorphous silicon film.
Figure 1B:
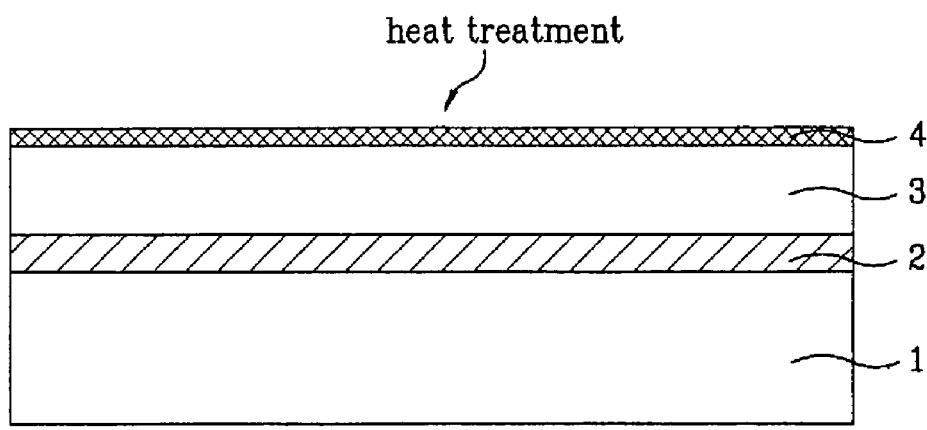
Figure 1C:
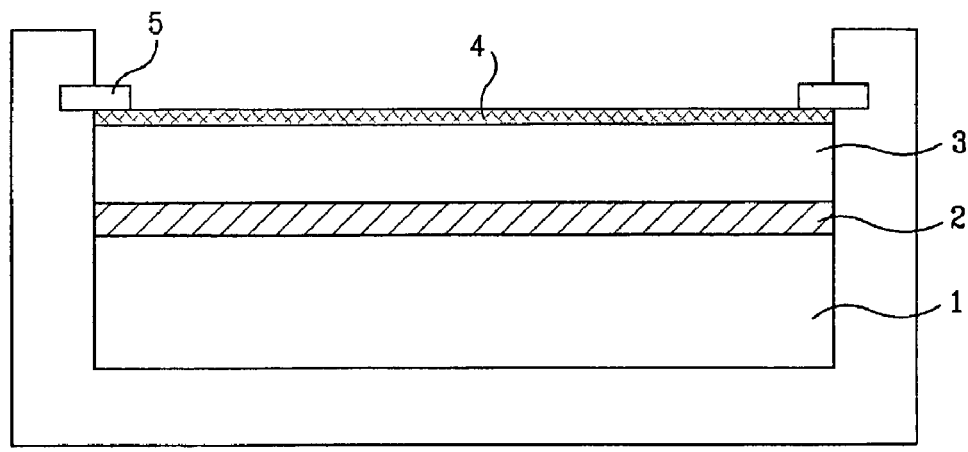
Figure 2A:
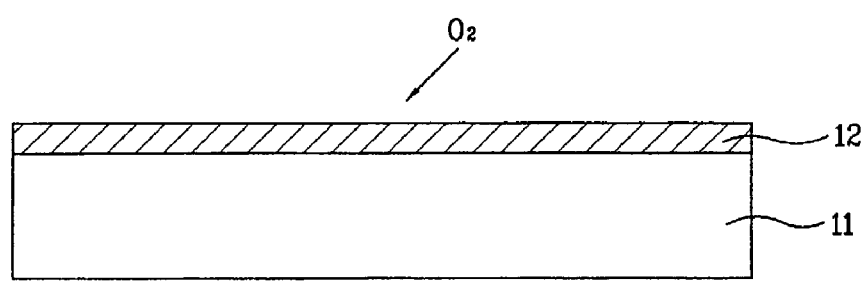
FIGS. 2A–2D illustrate the steps of a method for crystallizing an amorphous silicon film in accordance with a first embodiment of the present invention.

Referring to FIG. 2A, a silicon film is formed on a substrate 11, and made to react with oxygen $O_2$ or water vapor at a high temperature ranging from about 800–1200° C., to form a silicon oxide film ($SiO_2$) 12.

The silicon oxide film 12 prevents impurities in the substrate 11 from diffusing into the amorphous silicon thin film 13, and impedes a thermal flow into the substrate 11 in a later step.

Figure 2B:
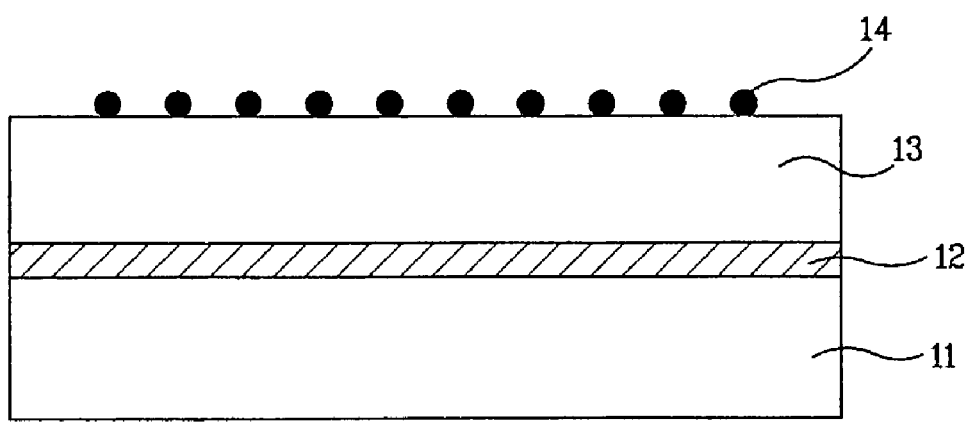

Referring to FIG. 2B, amorphous silicon is deposited on the silicon oxide film 12 at about 300–400° C. by using Plasma Enhanced Chemical Vapor Deposition (PECVD), Low-Pressure Chemical Vapor Deposition (LPCVD) using silane gas, or by sputtering, to form an amorphous silicon thin film 13, and the amorphous silicon thin film 13 is crystallized into polycrystalline silicon thin film by using Field Enhance Metal Induced Crystallization (FE-MIC), a low temperature crystallization by using a catalytic metal, and ultraviolet (UV) irradiation.

In detail, the catalytic metal 14 is disposed on the amorphous silicon thin film 13 by using plasma of a non-reactive gas.

The catalytic metal 14 may be nickel (Ni) or cobalt (Co), and a metal concentration incident to the amorphous silicon thin film 13 ranging from about $5\times10^{12}$–$5\times10^{14}$ particles/cm$^2$, and is disposed uniformly throughout an entire surface of the amorphous silicon thin film 13.

In this instance, it is important to control the amount of catalytic metal. If the amount of catalytic metal is large, a size of the crystalline grain is not large though the crystallization temperature decreases, and a leakage current may occur during driving the device due to remaining catalytic metal.

Figure 2C:
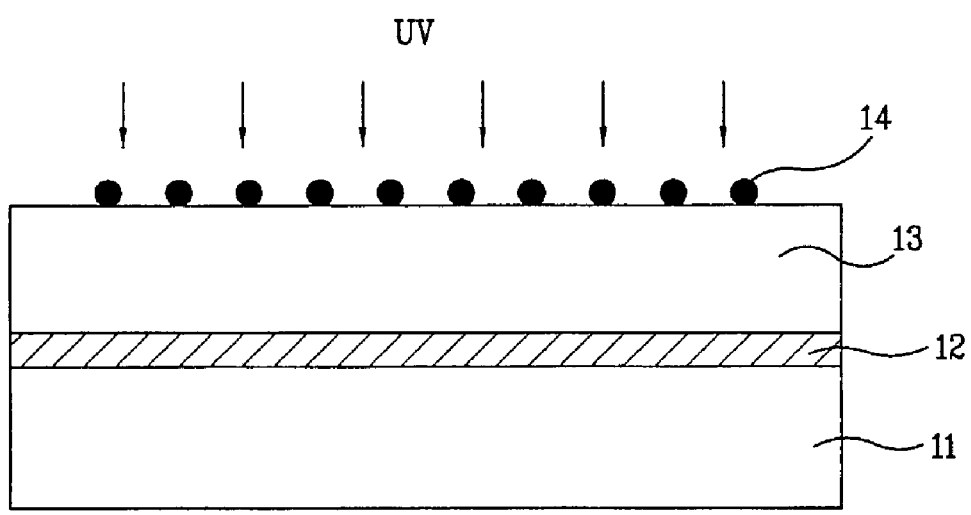

Next, referring to FIG. 2C, a UV ray with about an 100–400 nm wavelength is irradiated to a top side of the substrate having the catalytic metal 14 disposed thereon until a temperature of the amorphous silicon thin film 13 reaches about 300–1200°. Then, the catalytic metal diffuses from an interface with the silicon thin film toward the silicon thin film to form a silicide phase, which accelerates the crystallization, and decreases the crystallization temperature.

In this instance, the UV ray does not influence the glass substrate because the UV ray only heats the amorphous film owing to a difference of absorption coefficients of the amorphous film and the glass substrate.

Figure 2D:
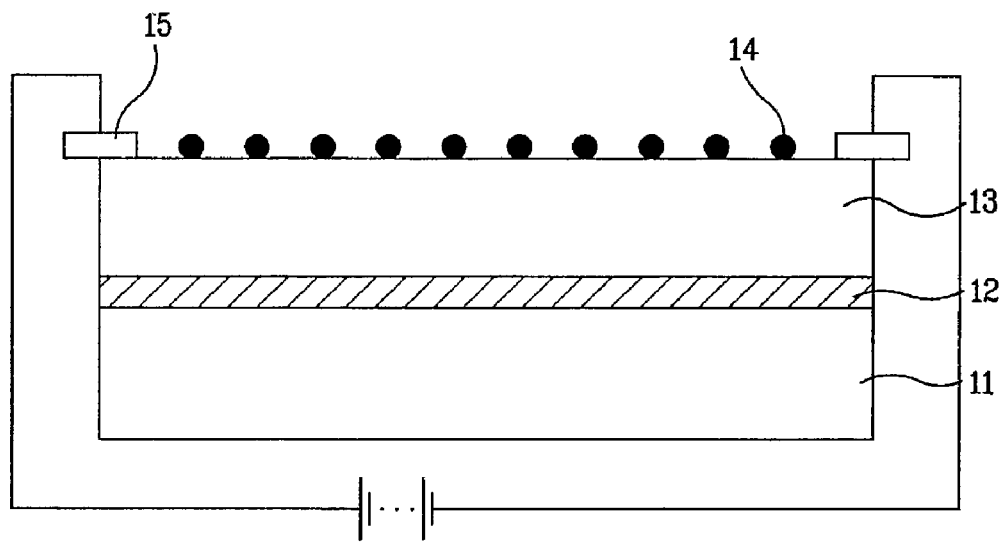

Then, referring to FIG. 2D, electrodes 15 are provided on opposite ends of the amorphous silicon thin film 13, and an electric field is applied thereto. Upon application of the electric field, a bonding energy of the amorphous silicon film decreases due to free electrons of the catalytic metal, to decrease the crystallization temperature and increase a crystallization rate.

For example, though approximately 10 hours of crystallization time is required at about 500° C. if no electric field is applied thereto, the crystallization time period is shortened to about within 10 minutes if the electric field is applied thereto.

The electrode is formed of molybdenum (Mo), or graphite, and the electric field has an intensity in a range of about 1–1000 V/cm, which is varied with time.

Thus, the amorphous silicon thin film 13 on the substrate 11 is crystallized into a polycrystalline silicon thin film.

Though an embodiment is introduced as an example, in which at first the UV ray is irradiated on the substrate having the catalytic metal injected thereto and the electric field is applied thereto for crystallization, the electric field may be applied simultaneously with the direction of the UV ray, or the UV ray may be irradiated after the electric field is applied thereto.

Second Embodiment

Figure 3:
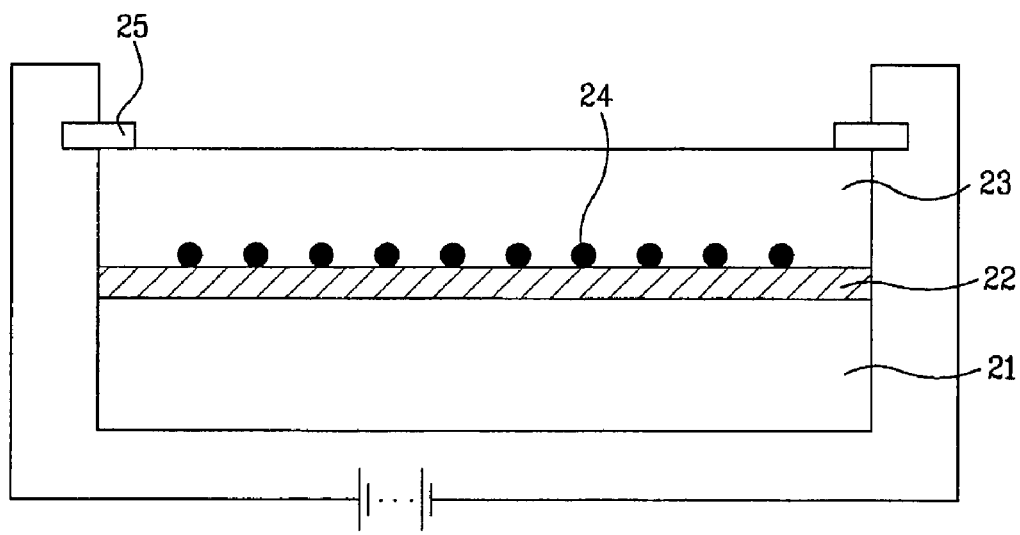
FIG. 3 illustrates a method for crystallizing an amorphous silicon film in accordance with a second embodiment of the present invention.

FIG. 3 illustrates a method for crystallizing an amorphous silicon film in accordance with a second embodiment of the present invention. As shown in FIG. 3, in the second embodiment, a catalytic metal is deposited under an amorphous silicon thin film.

A silicon oxide film (SiO$_2$) 22 is formed on a substrate 21 as a buffer layer. Then, an appropriate amount of a catalytic metal 24, such as nickel or the like, is disposed on the silicon oxide film 22 by using plasma of a non-reactive gas, and an amorphous silicon thin film 23 is formed on an entire surface including the catalytic metal 24 by depositing amorphous silicon by plasma CVD.

The catalytic metal 24 may be deposited at about $5\times10^{12}$–$5\times10^{14}$ particles/cm$^2$, and an amount of the catalytic metal is controlled for increasing a size of the crystalline grain and preventing a leakage current caused by remaining catalytic metal.

Then, annealing is carried out, in which a UV ray is irradiated to the top surface of the amorphous silicon thin film 23 with an underlying catalytic metal 24 until the substrate is heated to a temperature of about 100–1200° C., when the catalytic metal is diffused to the amorphous silicon thin film, to form nickel silicide (NiSi$_2$) while no thermal influence is given to the substrate. The UV ray has a wavelength of about 100–400 nm.

Next, electrodes 25 are provided on opposite ends of the amorphous silicon thin film 23, and an electric field with an intensity of about 1–1000 V/cm is applied, for growth of crystalline grain centered on the silicide.

In this instance, the electrode is formed of molybdenum (Mo), or graphite, and the intensity of the electric field is varied with time.

Thus, the amorphous silicon thin film 23 on the substrate 21 is crystallized into a polycrystalline silicon thin film.

Annealing by the UV ray and the application of the electric field may or may not be carried out simultaneously.

Third Embodiment

Figure 4:
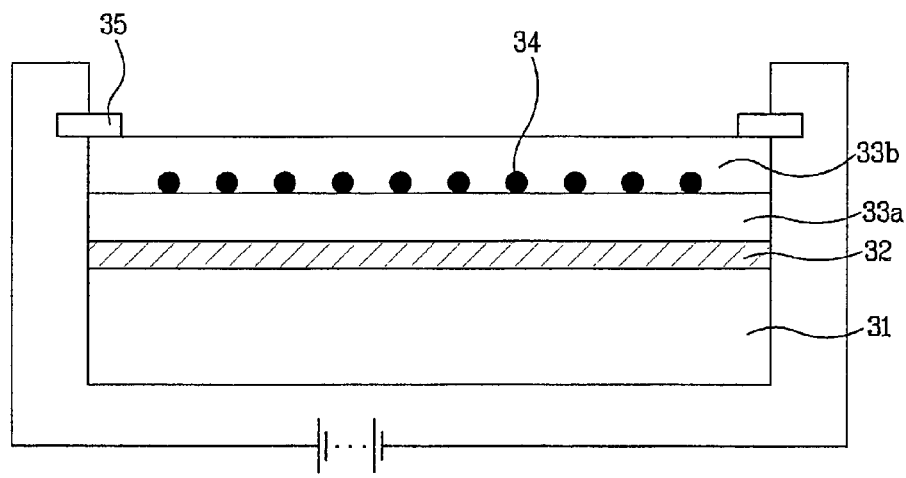
FIG. 4 illustrates a method for crystallizing an amorphous silicon film in accordance with a third embodiment of the present invention.

FIG. 4 illustrates a method for crystallizing an amorphous silicon film in accordance with a third embodiment of the present invention. As shown in FIG. 4, in the third embodiment, a catalytic metal is deposited in the middle of an amorphous silicon thin film.

Referring to FIG. 4, a silicon oxide film (SiO$_2$) 32 is formed on a substrate 31 as a buffer layer by using oxygen or water vapor to contact with a silicon thin film deposited on the substrate 31 to cause a chemical reaction.

Then, amorphous silicon is deposited on the silicon oxide film 32 by plasma CVD to form a first amorphous silicon thin film 33a, and an appropriate amount of catalytic metal 34, such as nickel, is disposed on the first amorphous silicon thin film 33a uniformly by using plasma of a non-reactive gas.

In this instance, a concentration of the disposal of the catalytic metal 34 is made to range from about $5\times10^{12}$–$5\times10^{14}$ particles/cm$^2$, and the amount is controlled for increasing a crystal grain size and preventing a leakage current caused by remaining catalytic metal.

Then, amorphous silicon is deposited on an entire surface including the catalytic metal 34, to form a second amorphous silicon thin film 33b. That is, the catalytic metal 34 is between the first amorphous silicon thin film 33a and the second amorphous thin film 33b.

Then, a UV ray with a wavelength of about 100–400 nm is irradiated on a top of the first and second amorphous silicon thin films 33a and 33b having the catalytic metal therebetween, until the thin films are heated to about 100–1200° C., so that the catalytic metal 34 is diffused from an interface with the silicon thin film toward the silicon thin film, to form a nickel silicide phase.

In this instance, by carrying out annealing by the irradiation of UV ray, the first and second amorphous silicon thin films 33a and 33b are heated while no thermal influence is given to the substrate 31.

Then, electrodes 35 are provided opposite ends of the amorphous silicon thin film 33a and 33b, and an electric field with an intensity in a range of about 1–1000 V/cm is applied thereto, for growing crystalline grains centered on nickel silicide. This crystallization by applying the electric field can decrease a crystallization temperature and shorten a crystallization time.

The electrode is formed of molybdenum or graphite, and the electric field is varied with time.

Thus, the first and second amorphous silicon thin film 33a and 33b formed on the substrate 31 are crystallized into a polycrystalline silicon thin film.

Annealing by the UV ray irradiation and the application of the electric field may or may not be carried out simultaneously.

Figure 5:
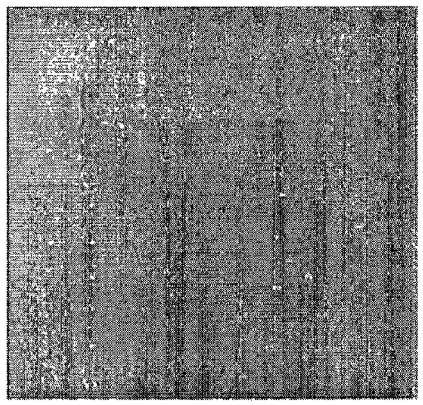
FIG. 5 illustrates optical microscopic photographs taken before and after crystallization.
Figure 5:
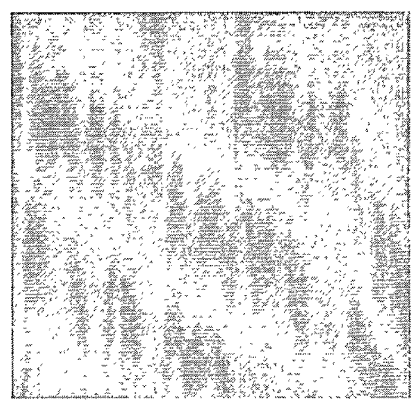

FIG. 5 illustrates optical microscopic photographs taken before and after crystallization.

Figure 6:
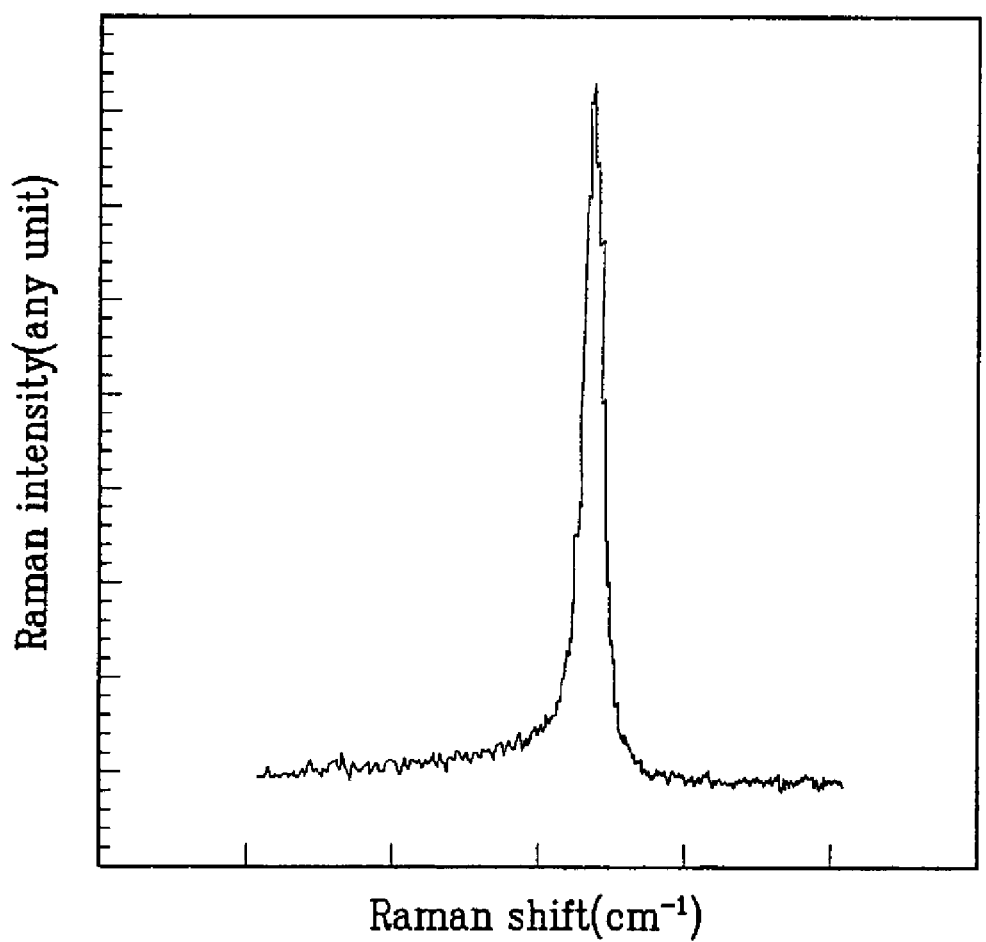
FIG. 6 illustrates a graph showing Raman spectra of the polycrystalline silicon of the present invention.

FIG. 6 illustrates a graph showing Raman spectra of the polycrystalline silicon of the present invention.

Referring to FIG. 5, it can be seen from the optical microscopic photograph of the silicon thin film having the technical aspect of the present invention applied thereto that an optical transmittivity of the polycrystalline silicon thin film is greater than the amorphous silicon thin film. The optical transmittivity represents a degree of crystallization.

The polycrystalline silicon is crystallized by depositing amorphous silicon, and injecting a catalytic metal at about $1.26 \times 10^{14}$ cm$^{-2}$ and applying an electric field with an intensity of about 30 V/cm at 500° C. for about 10 minutes.

In the meantime, referring to FIG. 6, it can be seen that a Raman spectra of the polycrystalline silicon formed in accordance with an embodiment of the present invention has a sharp peak caused by the crystalline silicon in the vicinity of about 520 cm$^{-1}$, and a moderate wide peak in the vicinity of 500 cm$^{-1}$ caused by fine crystalline grains. It can be seen that there is no peak caused by amorphous silicon in the vicinity of about 480 cm$^{-1}$ as evidence that there is no amorphous silicon, implying that the amorphous silicon is crystallized, completely. An accurate calculation shows about an 88.34% crystal ratio of volume fraction.

A method for fabricating an LCD using the method for crystallizing an amorphous silicon film in accordance with a first embodiment of the present invention applied to will be explained.

FIGS. 7A–7F illustrate a method for fabricating an LCD in accordance with an embodiment of the present invention.

Figure 7A:
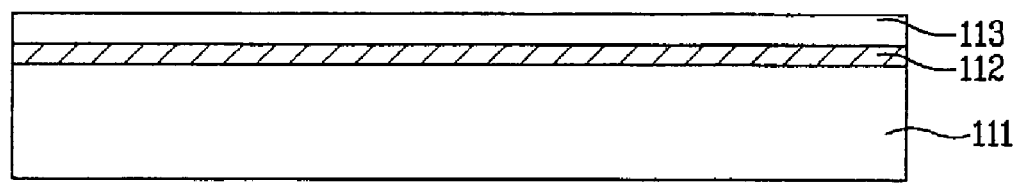
FIGS. 7A–7F illustrate a method for fabricating an LCD in accordance with an embodiment of the present invention.

Referring to FIG. 7A, a silicon film is formed on a first substrate 111, and made to chemically react with oxygen or water vapor at an elevated temperature of about 800–1200°, to form a silicon oxide film ($SiO_2$) 112, and amorphous silicon is deposited by plasma CVD, to form an amorphous silicon thin film 113.

Figure 7B:
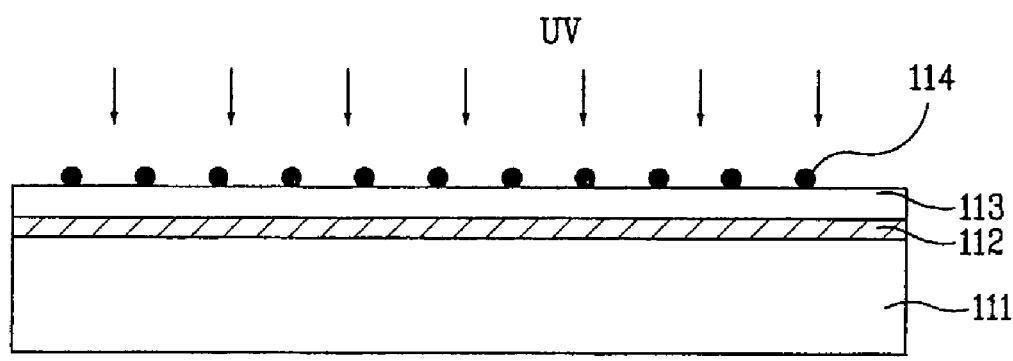

Next, referring to FIG. 7B, a catalytic metal 114 is disposed on the amorphous silicon thin film 113 by sputtering using plasma. The catalytic metal 114 may be nickel (Ni) or cobalt (Co) disposed at about $5 \times 10^{12}$–$5 \times 10^{14}$ particles/cm$^2$ uniformly, and an amount of the catalytic metal is controlled for increasing a size of the crystalline grain and preventing a leakage current.

Then, a NV ray with a wavelength of about 100–400 nm is irradiated to top of the substrate having the catalytic metal 114 disposed thereon until the amorphous silicon thin film 113 is heated to about 100–1200° C., when the catalytic metal is diffused to the amorphous silicon thin film, to form nickel silicide (NiSi$_2$) phase. The silicide accelerates crystallization, thereby decreasing the crystallization temperature. The irradiation of the UV ray elevates a temperature of the amorphous silicon thin film while causing no thermal deformation of the substrate.

Figure 7C:
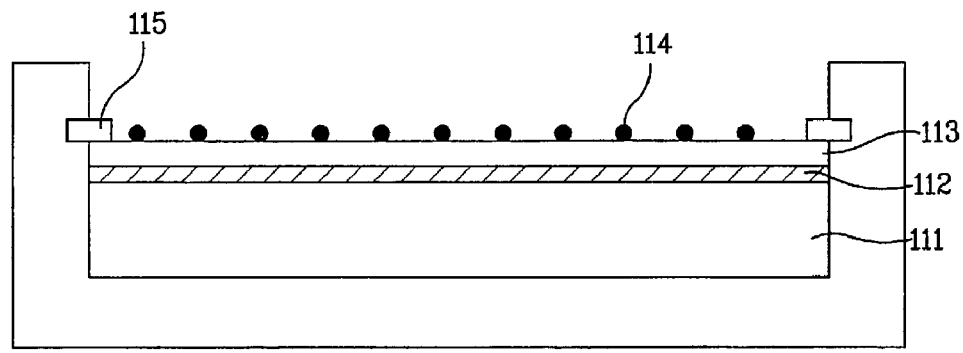

Referring to FIG. 7C, electrodes 115 are provided on opposite ends of the amorphous silicon thin film 113, and an electric field with a intensity ranging from about 1–1000 V/cm is applied thereto to cause growth of crystalline grains centered on the silicide. The intensity of the electric field is varied with time.

Thus, the amorphous silicon thin film 113 on the substrate 111 is crystallized into a polycrystalline silicon thin film. The irradiation of NV ray on the substrate having the catalytic metal disposed thereon and the application of the electric field may or may not be carried out simultaneously.

Figure 7D:
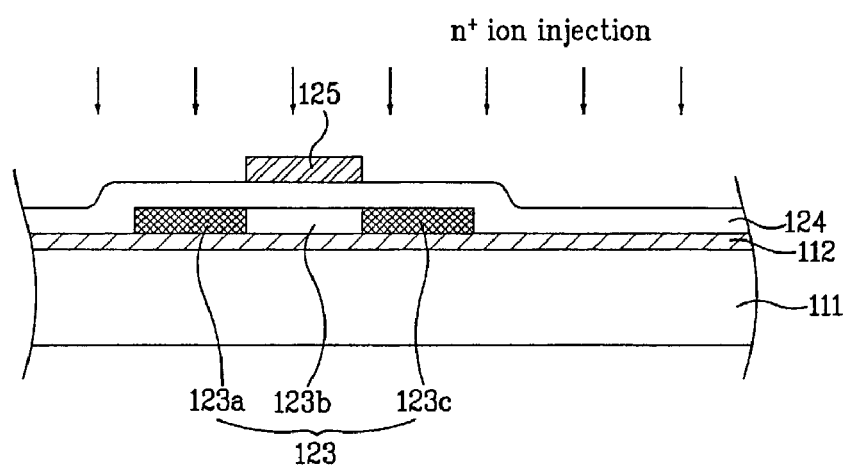

Referring to FIG. 7D, the polycrystalline silicon thin film is patterned, to form a semiconductor layer 123, and an insulating film of silicon nitride or the like is sputtered on an entire surface including the semiconductor layer 123, to form a gate insulating film 124 with a thickness of about 1800 Å.

A low resistance metal is deposited on the gate insulating film 124 to a thickness around 3000 Å, and patterned by photolithography to form a gateline and a gate electrode 125 connected to the gateline.

Then, n$^+$ impurities are ion injected into the semiconductor layer 123 with the gate electrode 125 used as a mask, and the injected ions are activated by laser irradiation or high temperature heat treatment in a range of about 450° C., to form source/drain regions 123a/123c and a channel region 123b.

Figure 7E:
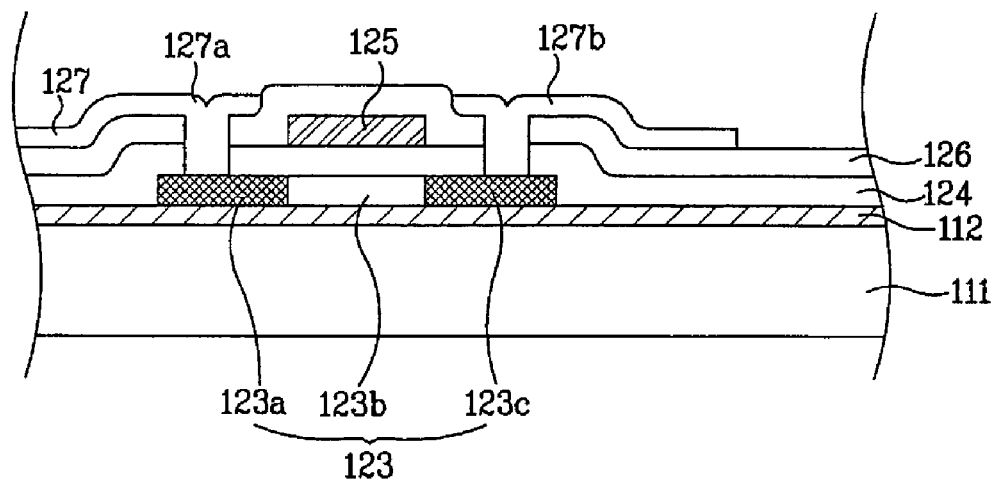

Referring to FIG. 7E, an insulating film of silicon nitride with a low dielectric constant is deposited on an entire surface inclusive of the gate electrode 125 by plasma CVD, to form an interlayer insulating film 126, and the interlayer insulating film 126 and the gate insulating film 124 are removed selectively, to expose a part of each of the source/drain regions 123a/123c.

Then, a low resistance metal is deposited on the interlayer insulating film 126, patterned by photolithography, to form a dataline 127 crossing the gateline and source/drain electrodes 127a/127b connected to the source/drain regions 123a/123c.

The semiconductor layer of the polycrystalline silicon, the gate electrode, the source/drain electrodes form a polycrystalline silicon thin film transistor arranged at a point where the gateline and the dataline are crossed.

Since the control of the amount of catalytic metal leaves almost no catalytic metal in the channel region of the polycrystalline silicon thin film transistor, no leakage current caused by remaining catalytic metal occurs.

Figure 7F:
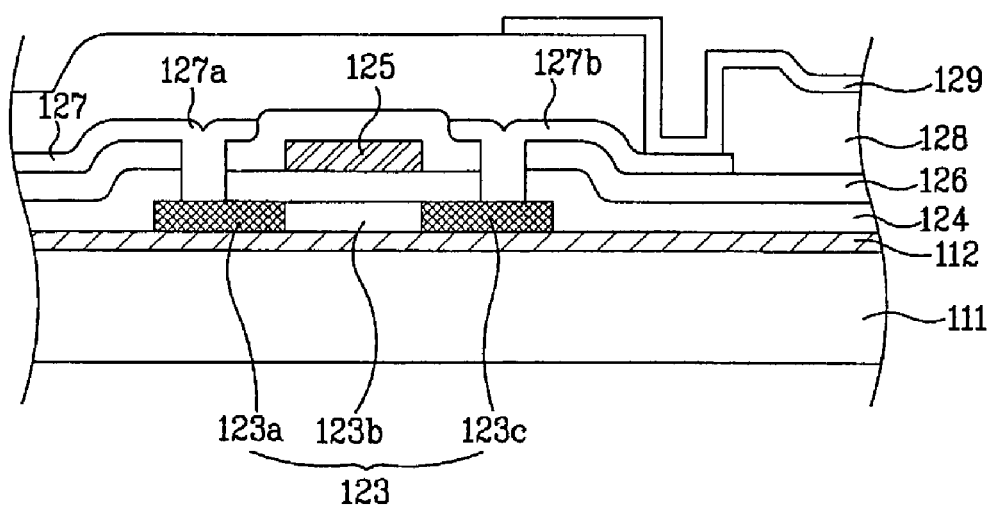

In succession, referring to FIG. 7F, a thickness of an insulating film, such as benzocyclobulene (BCB), acrylic resin, silicon nitride, or the like, is formed on an entire surface inclusive of the source/drain electrodes 127a/127b, to form a protection film 128.

A transparent conductive film of indium tin oxide (ITO) or the like is deposited on the protection film 128, and patterned, to form a pixel electrode 129 connected to the drain electrode 127b.

Next, though not shown, a color filter layer of Red, Green, Blue (R, G, B) is formed on a second substrate by dyeing, electrodeposition, pigment spraying, printing or the like, and a common electrode of ITO is formed on the color filter layer.

Finally, the first substrate and the second substrate are aligned, and bonded, liquid crystal is injected into a few micrometers of space between the substrates, and a liquid crystal injection hole is sealed, to complete fabrication of an LCD of polycrystalline silicon.

The foregoing method for fabricating an LCD using the first embodiment of the method for crystallizing an amorphous silicon film applied thereto may have a variety of embodiments. Though the foregoing embodiment describes crystallization of an amorphous silicon thin film as an amorphous film, the technical aspect of the present invention is not limited to the crystallization of the amorphous silicon thin film.

As has been explained, the method for crystallizing an amorphous film and the method for fabricating an LCD by using the same have the following advantages.

First, the crystallization of the amorphous silicon film into a polycrystalline film by applying an electric field and irradiating an UV ray can shorten a crystallization time period, thereby minimizing deformation of a large sized substrate, and coping with the trend of size increasing of the substrate with flexibility.

Second, the low temperature crystallization of an entire thin film allows the use of a glass substrate, and provides crystalline grains with excellent properties.

Accordingly, in place of the laser polycrystalline silicon film used presently, the polycrystalline silicon film of the present invention can be used as a polycrystalline silicon film required for a thin film transistor LCD, solar cells, image sensors, and the like. Moreover, the advantage of availability of low temperature fabrication may replace a polycrystalline silicon film formed by a high temperature solid state crystallization.

It will be apparent to those skilled in the art that various modifications and variations can be made in the method for crystallizing an amorphous film and the method for fabricating a liquid crystal display (LCD) by using the same of the present invention without departing from the spirit or scope of the invention. Thus, it is intended that the present invention cover the modifications and variations of this invention provided they come within the scope of the appended claims and their equivalents.

What is claimed is:

1. A method for crystallizing an amorphous film, comprising:
    forming the amorphous film having a catalytic metal on a glass substrate;
    irradiating a ultraviolet (UV) ray having a wavelength of about 100–400 nm on the amorphous film to increase a temperature of the amorphous film up to about 300–1200° C., whereby the catalytic metal becomes a metal silicide; and
    applying an electric field to the amorphous film.

2. A method of claim 1, wherein the catalytic metal is formed on top of the amorphous film.

3. A method of claim 1, wherein the catalytic metal is formed under the amorphous film.

4. A method of claim 1, wherein the catalytic metal is formed in a middle layer of the amorphous film.

5. A method of claim 4, wherein forming the catalytic metal in the middle layer of the amorphous film includes:
    forming a first amorphous film on the substrate,
    depositing the catalytic metal on the first amorphous film, and
    forming a second amorphous film on the first amorphous film including of the catalytic metal.

6. A method of claim 1, wherein irradiating a UV ray on the amorphous film and applying an electric field to the amorphous film is carried out simultaneously.

7. A method of claim 1, wherein irradiating a UV ray on the amorphous film and applying an electric field to the amorphous film is not carried out simultaneously.

8. A method of claim 1, wherein the electric field is varied with time.

9. A method of claim 1, wherein the electric field has an intensity of about 1–1000 V/cm.

10. A method of claim 1, wherein the catalytic metal is nickel.

11. A method of claim 1, wherein the catalytic metal is deposited by plasma.

12. A method of claim 1, wherein catalytic metal is deposited at about $5 \times 10^{12}$–$5 \times 10^{14}$ particles/cm$^2$.

13. A method of claim 1, wherein the amorphous film is formed of amorphous silicon.

14. A method of claim 1, further comprising forming a buffer layer on the substrate before forming an amorphous film having a catalytic metal deposited thereon on a substrate.

15. A method for fabricating an LCD using a method for crystallizing an amorphous silicon film, comprising:
    forming an amorphous film having a catalytic metal on a first substrate of glass;
    irradiating a ultraviolet (UV) ray having a wavelength of about 100–400 nm on the amorphous film to increase a temperature of the amorphous film up to about 300–1200° C. for forming a metal silicide from the catalytic metal, and applying an electric field to the amorphous film, to crystallize the amorphous film into a polycrystalline film;
    patterning the polycrystalline film to form a semiconductor layer;
    forming a gate electrode on a region of the semiconductor layer insulated from the gate electrode;
    injecting impurities into the semiconductor layer, to form a channel region, and source/drain regions;
    forming source/drain electrodes connected to the source/drain regions, respectively;
    forming a pixel electrode connected to the drain electrode; and
    forming a liquid crystal layer between the first substrate and a second substrate opposite to the second substrate.

16. A method of claim 15, wherein the catalytic metal is formed on one of a top of, under and in a middle layer of, the amorphous film.

17. A method of claim 16, wherein forming the catalytic metal in the middle layer of the amorphous film includes:
    forming a first amorphous film on the substrate,
    depositing the catalytic metal on the first amorphous film; and
    forming a second amorphous film on the first amorphous film including of the catalytic metal.

18. A method of claim 15, wherein irradiating the UV ray and applying an electric field is carried out simultaneously.

19. A method of claim 15, wherein irradiating the UV ray and applying an electric field is not carried out simultaneously.

20. A method of claim 15, wherein the electric field is varied with time.

21. A method of claim 15, wherein the electric field has an intensity of about 1–1000 V/cm.

22. A method of claim 15, wherein the catalytic metal is nickel.

23. A method of claim 15, wherein the catalytic metal is deposited at about $5 \times 10^{22}$–$5 \times 10^{14}$ particles/cm$^2$.

24. A method of claim 15, further comprising:
    forming a gate line together with the gate electrode; and
    forming a data line crossing the gate line together with the source/drain electrodes.

25. A method of claim 15, further comprising:
forming an insulating film on an entire surface including the gate electrode after forming a gate electrode on a region of the semiconductor layer insulated from the gate electrode.

26. A method of claim 25, wherein the insulating film is formed of silicon nitride or silicon oxide.

27. A method of claim 15, further comprising forming a protection film which exposes a part of the drain electrode after forming source/drain electrodes connected to the source/drain regions, respectively.

28. A method of claim 27, wherein the protection film is formed of one of benzocyclobutene (BCB), acrylic resin, silicon nitride, and silicon oxide.

29. A method of claim 15, wherein the amorphous film is formed of amorphous silicon.

30. A method of claim 15, further comprising forming a buffer layer on the substrate before forming an amorphous film having a catalytic metal deposited thereon on a first substrate.

* * * * *